United States Patent
Okuda et al.

(10) Patent No.: US 7,059,036 B2
(45) Date of Patent: Jun. 13, 2006

(54) APPARATUS FOR HOLDING AND MOUNTING A COMPONENT

(75) Inventors: Osamu Okuda, Yamanashi-ken (JP); Yoshihiro Yoshida, Neyagawa (JP); Akira Kabeshita, Hirakata (JP); Satoshi Shida, Hirakata (JP); Naoyuki Kitamura, Yamanashi-ken (JP)

(73) Assignee: Matsushita Electric Industrial Co., Ltd., Osaka-fu (JP)

( * ) Notice: Subject to any disclaimer, the term of this patent is extended or adjusted under 35 U.S.C. 154(b) by 0 days.

(21) Appl. No.: 11/109,739

(22) Filed: Apr. 20, 2005

(65) Prior Publication Data

US 2005/0183263 A1    Aug. 25, 2005

Related U.S. Application Data

(62) Division of application No. 09/921,982, filed on Aug. 6, 2001, now Pat. No. 6,895,662, which is a division of application No. 09/158,536, filed on Sep. 22, 1998, now Pat. No. 6,298,547.

(30) Foreign Application Priority Data

Sep. 25, 1997 (JP) .................................. 9-259708
Nov. 10, 1997 (JP) .................................. 9-307407

(51) Int. Cl.
*H05K 13/04* (2006.01)

(52) U.S. Cl. .......................... 29/740; 29/741; 29/743; 29/834; 29/DIG. 44

(58) Field of Classification Search ........... 29/740–743, 29/DIG. 44, 832–834; 414/737, 752; 294/2, 294/64.1; 901/40–47
See application file for complete search history.

(56) References Cited

U.S. PATENT DOCUMENTS 4,624,050 A   11/1986  Hawkswell
4,703,965 A   11/1987  Lee et al.
4,754,545 A    7/1988  Elliott (Continued)

FOREIGN PATENT DOCUMENTS

JP    11-297749    10/1999

OTHER PUBLICATIONS

"New Automated Mounting Equipment Handles Cylindrical Chip Capacitors", vol. 16, No. 154, JEE, (Oct. 1979) p. 32-36, Hideo Shirouchi.

*Primary Examiner*—Minh Trinh
(74) *Attorney, Agent, or Firm*—Wenderoth, Lind & Ponack, L.L.P.

(57) ABSTRACT

An electronic component mounting apparatus which employs a first air feed device connected to an air passage at one end part of a spline shaft, and a second air feed device connected to the air passage in the vicinity of the other end of the spline shaft. The first and second air feeds function to supply air to the air passage to return an interior thereof to atmospheric pressure. The time required to return the vacuum pressure in the air passage to atmospheric pressure can be shortened by the use of the two separate air feeds.

18 Claims, 15 Drawing Sheets

U.S. PATENT DOCUMENTS

| | | |
|---|---|---|
| 4,852,247 A | 8/1989 | Hawkswell |
| 5,255,429 A | 10/1993 | Nishi et al. |
| 5,307,558 A | 5/1994 | Izume et al. |
| 5,727,311 A | 3/1998 | Ida et al. |
| 5,745,241 A | 4/1998 | Hashimoto |
| 5,758,410 A | 6/1998 | Asai et al. |
| 5,761,798 A | 6/1998 | Suzuki |
| 5,960,534 A | 10/1999 | Yazawa et al. |
| 6,076,394 A | 6/2000 | Tsuda et al. |
| 6,161,886 A | 12/2000 | Furuya et al. |
| 6,240,628 B1 | 6/2001 | Yoshida et al. |
| 6,276,051 B1 | 8/2001 | Asai et al. |
| 6,298,547 B1 * | 10/2001 | Okuda et al. ............. 29/740 |
| 6,895,662 B1 * | 5/2005 | Okuda et al. ............. 29/740 |

\* cited by examiner

APPARATUS FOR HOLDING AND MOUNTING A COMPONENT

This application is a divisional of U.S. Ser. No. 09/921,982, filed Aug. 6,2001, now U.S. Pat. No. 6,895,662 which is a divisional of U.S. Ser. No. 09/158,536, filed Sep. 22, 1998, now U.S. Pat. No. 6,298,547.

BACKGROUND OF THE INVENTION

The present invention relates to an apparatus for holding components of a type, e.g., mounting electronic components on electronic circuit boards, a component mounting apparatus with the component holding apparatus and a component mount method carried out by the component mounting apparatus.

A component sucking head part of a component mounting apparatus, which automatically mounts electronic components to an electronic circuit board, has a nozzle for sucking the electronic components and thereby mounting the component to the electronic circuit board. To precisely control touching of the nozzle and the electronic component at the time of the sucking and mounting is one factor in improving the quality of the electronic circuit board produced. An example of a conventional electronic component mounting apparatus will be described with reference to FIG. 14.

FIG. 14 shows a component sucking head part 101 comprising the nozzle, a suction device 103 for sucking the electronic component by the nozzle, an X-Y robot 102 for moving the head part 101 in X, Y directions and a control device 104 for controlling operations of the head part 101. The head part 101 is constructed as described hereinbelow. FIG. 14 shows only primary parts constituting the head part 101, and a body part of the head part 101, etc. are not illustrated in the drawing. A reference numeral 135 in FIG. 14 denotes a spline shaft, having a nozzle 136 set at one end part 135a for sucking an electronic component 138 through a suction operation and, a rotation receiver 143 provided at the other end part 135b.

The suction device 103 for carrying out the suction operation is connected to the other end part of the spline shaft via a suction tube 105. The air is sucked through the nozzle 136 and the spline shaft 135 to the suction device 103 by the suction operation of the suction device 103. A blow device 106 branches off the suction tube 105 and is connected to the other end part 135b of the spline shaft 135. The blow device 106 includes a valve for returning the interiors of the spline shaft 135 and nozzle 136 from a state in vacuum to a state of atmospheric pressure so as to free the electronic component 138 from the suction operation by the nozzle 136.

Two nuts 131, 134 are fitted to the spline shaft 135 to allow the spline shaft 135 to slide in the axial direction. These nuts 131, 134 are held to the body part (not shown) of the head part 101 via respective bearings 132, 133. The spline shaft 135 is accordingly movable in the axial direction relative to the body part and also rotatable about an axis of the spline shaft 135.

The rotation about the axis of the spline shaft 135 is conducted by a motor 142. A pulley 139 is engaged with the spline shaft 135, which rotates along with the spline shaft 135. The spline shaft 135 is movable in the axial direction relative to the pulley 139. Meanwhile, a pulley 141 is connected to a driving shaft of the motor 142. The pulley 139 and pulley 141 are coupled by a belt 140. When the pulley 141 is rotated by the motor 142, the spline shaft 135 is rotated about the axis via the belt 140 and pulley 139.

The movement in the axial direction of the spline shaft 135 is achieved by a motor 149. More specifically, a nut 146 projecting a lever 147 is meshed with a ball screw 145 connected to a driving shaft of the motor 149 via a coupling 148. The lever 147 has, at its leading end, a roller 144 fitted in a groove 143a formed in the rotation receiver 143. Therefore, when the ball screw 145 is rotated by the motor 149, the lever 147 moves in the axial direction with the roller 144 engaged with the rotation receiver 143, thereby moving the spline shaft 135 in the axial direction.

The operation of the conventional component mounting apparatus in the above construction will be described with reference to FIG. 15.

At step (denoted by "S" in the drawing) 101, the X-Y robot 102 is moved by a control operation of the control device 104, thereby moving the head part 101 to a component suction position where the electronic component is to be sucked. At next step 102, the motor 149 is driven through the control of the control device 104 and, the spline shaft 135, namely, nozzle 136 is lowered. The suction device 103 is activated at step 103, and as a consequence the electronic component is sucked by the nozzle 136 at step 104. At step 105, the ball screw 145 is turned in reverse-rotation by the motor 149 to move the nozzle 136 up. Thereafter, the motor 142 is driven by the control of the control device 104 to rotate the nozzle 136 to a proper position so as to correctly position the sucked electronic component in a mount direction. At subsequent step 106, the X-Y robot is operated again to move position on the motor 149 is driven again to move the nozzle 136 down. Then at step 108 the electronic component 138 is mounted on the electronic device 106 is driven. After The mounting, the suction to the electronic component is released, at step 109, and then the nozzle 136 is raised via the spline shaft 135.

Recently, high-speed operation is required for the mounting of the electronic component 138. However, in the above-described conventional component mounting apparatus, the blow device 106 is connected to the other end part 135b opposite to the one end part 135a of the spline shaft 135 where the nozzle 136 for sucking of the electronic component 138 is arranged. Therefore, it takes a long time for the interior of the nozzle 136 to return to atmospheric pressure state after the blow device 106 is activated to release the suction of the electronic component 138. In other words, the nozzle 136 stands still for a long time (a portion IV in FIG. 16) in a state while the electronic component 138 is mounted on the circuit board, thereby there is a disadvantage that the mounting time (a portion V in FIG. 16) required for mounting the electronic component 138 is increased. In the meantime, if the blow device 106 were started earlier during the descent of the nozzle 136 to shorten the above mounting time, the nozzle 136 would be returned to the atmospheric pressure state before the electronic component 138 is completely mounted on the circuit board, thus causing the electronic component 138 to be blown away and mounted unstably.

SUMMARY OF THE INVENTION

The present invention was developed to solve the aforementioned disadvantages and has for its object to provide an apparatus for holding components, an apparatus for mounting components which comprises the component holding apparatus and a method for mounting components, whereby the mounting time for mounting components is shortened as compared with the prior art.

In order to achieve the above-described object, according to a first aspect of the present invention, there is provided an apparatus for holding a component which includes a shaft with a nozzle for holding of the component set at one end part thereof and moved in an axial direction of the shaft.

The component holding apparatus comprising:

a suction device which is connected at the other end part of the shaft to an air passage formed in the shaft and communicating with the nozzle and which sucks an interior of the air passage, thereby letting the nozzle suck the component via the air passage and hold the component;

a first blow device which is connected at the other end part of the shaft to the air passage and which returns the interior of the air passage to a state of an atmospheric pressure, thereby releasing the suction of the component to the nozzle; and a second blow device which is connected in the vicinity of the one end part of the shaft to the air passage and which returns the interior of the air passage to the atmospheric pressure state, thereby releasing the suction of the component to the nozzle.

An apparatus for mounting components according to a second aspect of the present invention has the component holding apparatus of the first aspect.

The component mounting apparatus may be provided with a control device connected to the first blow device and the second blow device, the control device controlling an air feed start timing of the first blow device and the second blow device so that the air passage is turned to the atmospheric pressure state in a period from a time of the nozzle holding the component and reaching a lowest fall point to a time of the nozzle starting to rise, thereby freeing the holding of the component and then mounting the component on an object to which the component is to be mounted.

The feed start timing can be controlled on the basis of the weight of the component held by the nozzle.

In an apparatus for holding components in a third aspect of the present invention, there is provided an apparatus for holding a component, which comprises:

a shaft having a nozzle for holding of a component at one end part of the shaft and an air passage connecting the nozzle with an interior of voice coil motor, which is movable in an axial direction of the shaft in parallel to a groove formed in a circumferential face in the axial direction thereof and rotatable in a direction about an axis of the shaft;

the voice coil motor formed like a can extending in the axial direction of the shaft, with having a casing in which the shaft penetrates a central part in a state to be movable in the axial direction and rotatable about the axis, wherein either one of a magnet and a coil is fixed to the circumferential face of the shaft and the other one of the coil and the magnet is arranged inside the casing at the side of a periphery of the shaft, thereby moving the shaft in the axial direction by an action of the magnet and the coil;

a suction device connected to the voice coil motor to suck the interior of the voice coil motor and a interior of the air passage, thereby letting the nozzle suck and hold the component;

a first blow device connected via a suction tube to the voice coil motor and which returns the interiors of the voice coil motor and the air passage to a state of an atmospheric pressure, thereby releasing the suction of the component to the nozzle;

a second blow device connected to the voice coil motor and which returns the interiors of the voice coil motor and the air passage to the atmospheric pressure state faster than the first blow device, thereby releasing the suction of the component to the nozzle; and a sealing member with a first packing which is set at a part of the casing of the voice coil motor where the shaft penetrates, formed in the same sectional shape as the shaft, has a hole through which the shaft penetrates, and prevents a leakage of air at the penetration part at a suction operation to the interior of the voice coil motor by the suction device.

In a component holding apparatus according to a fourth aspect of the present invention, the sealing member may further comprise a pair of second packings formed of a material of higher rigidity than that of the first packing, with holding the first packing therebetween, the second packing having a hole through which the shaft penetrates and a projecting part in the periphery of the hole which is to be fitted in the groove thereby rotating the second packing in the same direction as the direction about the axis of the shaft without accompanying a relative displacement to the shaft when the shaft rotates in the direction about the axis.

In a component holding apparatus according to a fifth aspect of the present invention, the sealing member of the component holding apparatus according to the above fourth aspect may also be provided with an urging member interposed between the first packing and a packing at the side of the motor in touch with the casing of the voice coil motor among the second packings, which urges the packing at the motor side to the casing with a pressing force breaking an air passage generated at a contact face part between the packing at the motor side and the casing when the interior of the voice coil motor is returned to the atmospheric pressure state by the first blow device and the second blow device, thereby preventing the leakage of air at the suction operation.

In an apparatus for mounting components in a sixth aspect of the present invention has the component holding apparatus of the third-fifth aspects.

The component mounting apparatus of the sixth aspect may include a control device connected to the first blow device and the second blow device, the control device controlling an air feed start timing of the first blow device and the second blow device so that the air passage is turned to the atmospheric pressure state in a period from a time of the nozzle holding the component and reaching a lowest fall point to a time of the nozzle starting to rise, thereby freeing the holding of the component and mounting the component on an object to which the component is to be mounted.

The feed start timing may be a time point when the nozzle reaches the lowest fall point if a weight of the component held by the nozzle exceeds approximately 5 g.

In a method for mounting components according to a seventh aspect of the present invention, there is provided a method for mounting an electronic component onto a circuit board by moving down a nozzle sucking the electronic component to a lowest fall point in a thicknesswise direction of the electronic component, whereby an air feed start timing into the nozzle is set so that an interior of the nozzle is turned to a state of atmospheric pressure in a period from a time of the nozzle reaching the lowest fall point to a time of the nozzle starting to rise in the thicknesswise direction, thereby releasing the suction and mounting the electronic component onto the circuit board.

In the component mount method according to the seventh aspect, the air feed into the nozzle may be terminated at a time point agreeing with a time point when the nozzle starts to rise.

Further, in the component mount method of the seventh aspect, the feed start timing may be a time point when the nozzle reaches the lowest fall point if the weight of the electronic component held by the nozzle exceeds approximately 5 g.

According to the component holding apparatus of the first and third aspects of the present invention and the component mounting apparatus of the second and sixth aspects, because of the adoption of the above construction, the first blow device which is connected to the air passage at the other end part of the shaft to return the interior of the air passage to the atmospheric pressure state, and the second blow device which is connected to the air passage in the vicinity of the one end part of the shaft to return the interior of the air passage to the atmospheric pressure state are provided, so that a time required for returning the vacuum pressure in the air passage to the atmospheric pressure can be shortened in comparison with the prior art.

According to the component holding apparatus of the third-fifth aspects of the present invention, the presence of the sealing member prevents the leakage of air at the part where the shaft penetrates the casing of the voice coil motor even when the component holding apparatus is of a type sucking the air passage through the interior of the voice coil motor. Particularly the component holding apparatus of the fifth aspect is provided further with the urging member pressing the packing at the side of the motor to the casing of the voice coil motor. The leakage of air at the penetration part by the shaft at the suction operation is hence more effectively prevented in the component holding apparatus of a type sucking the air passage through the interior of the voice coil motor thereby returning to the atmospheric pressure state.

According to the component mount method of the seventh aspect of the present invention, the air feed start timing to the nozzle is set so that the nozzle is brought thereinside to the atmospheric pressure state in a time after the nozzle reaches the lowest fall point before the nozzle starts to rise, thereby releasing the suction and mounting the electronic component on the circuit board. Thus the time required for returning the vacuum pressure in the air passage to atmospheric pressure can be shortened in comparison with the prior art.

BRIEF DESCRIPTION OF THE DRAWINGS

These and other objects and features of the present invention will become clear from the following description taken in conjunction with the preferred embodiments thereof with reference to the accompanying drawings, in which.

DETAILED DESCRIPTION OF THE PREFERRED EMBODIMENTS

Figure 14:
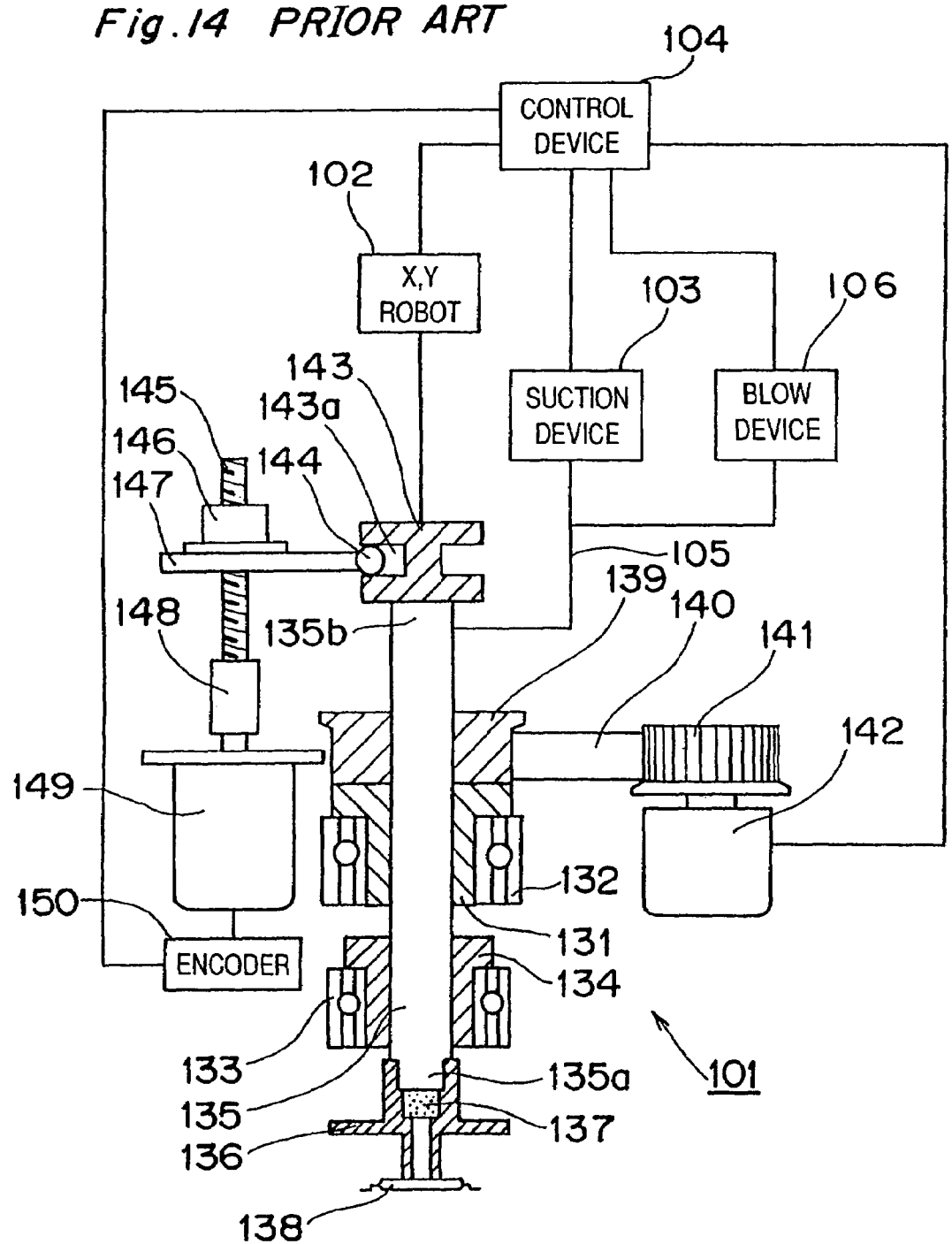
FIG. 14 is a diagram showing the structure of a conventional component holding apparatus.
Figure 15:
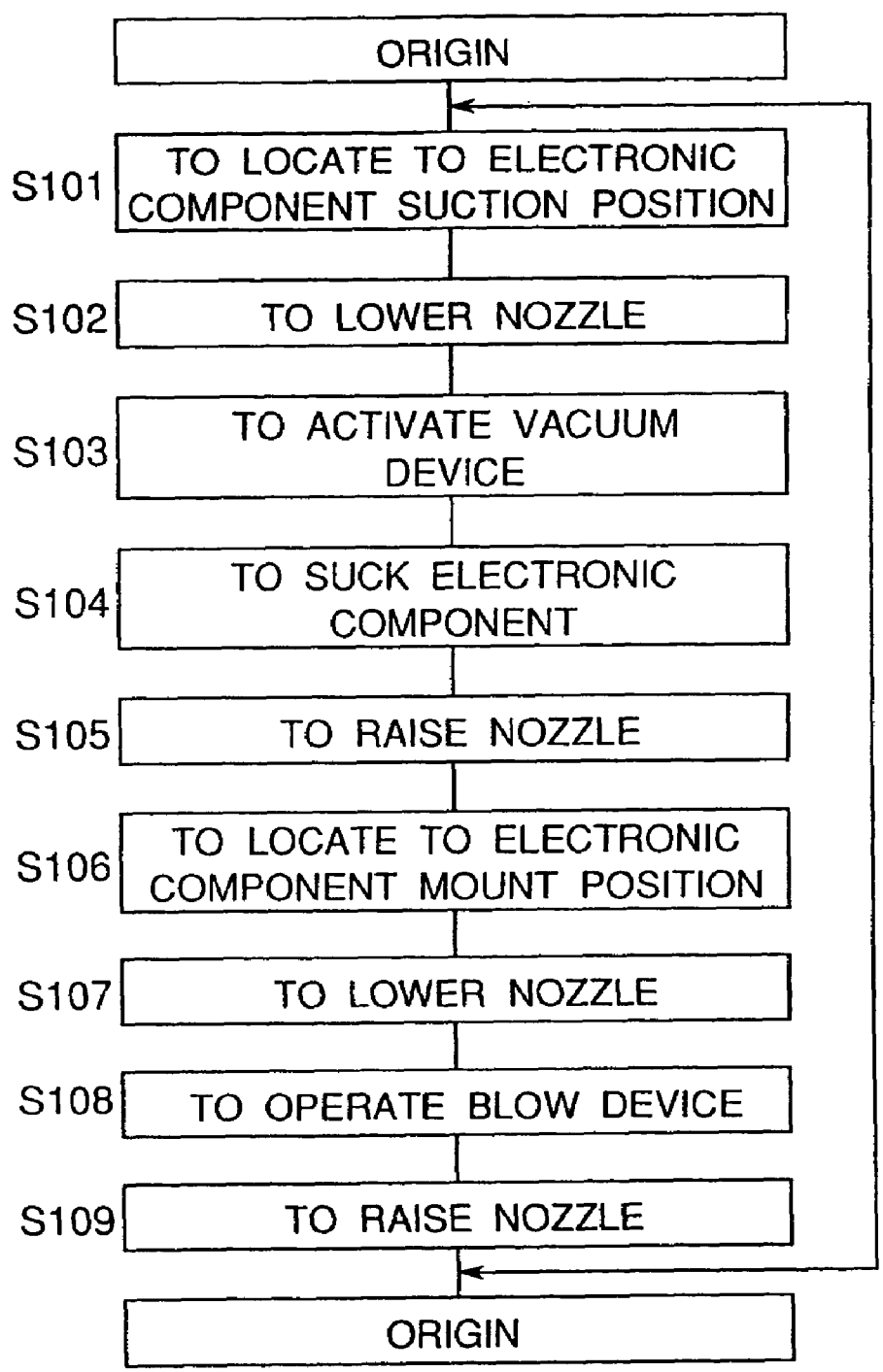
FIG. 15 is a flow chart of the operation of the component holding apparatus of FIG. 14.
Figure 16:
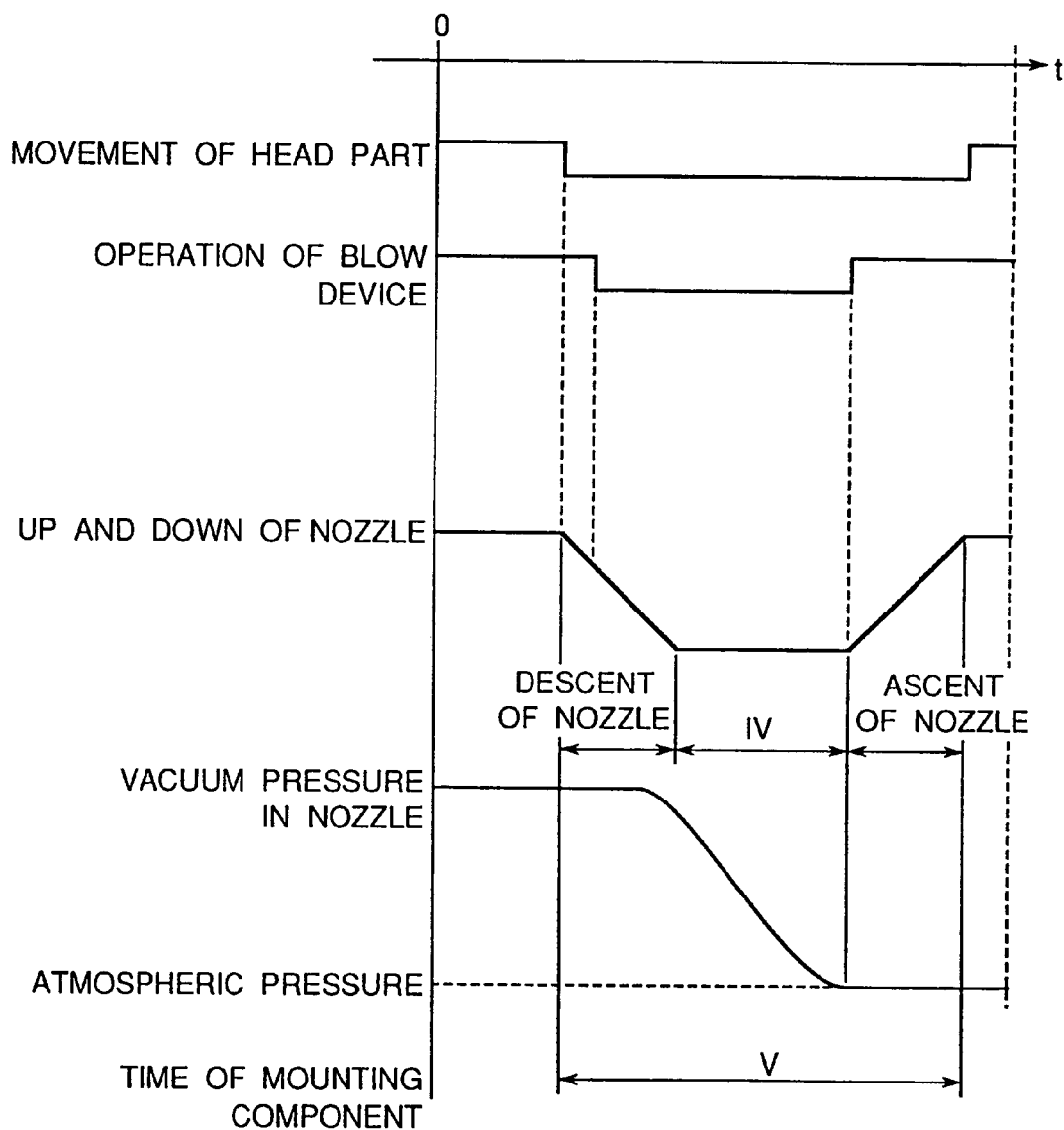
FIG. 16 is a timing chart of the operation related to the component holding apparatus of FIG. 14.

An apparatus for holding components, an apparatus for mounting components which comprises the component holding apparatus, and a component mount method carried out by the component mounting apparatus according to preferred embodiments of the present invention will be described below with reference to the drawings. Like parts are designated by like reference numerals throughout the drawings including FIGS. 14 and 15 used in the foregoing description, and the description of the like parts will be omitted here. A part performing the function of the "component holding apparatus" in the above SUMMARY OF THE INVENTION corresponds to a part having a component sucking head part 206, a suction device 103, a first blow device 106 and a second blow device 217, and moreover corresponds to a part with a sealing member 351 or 451 or 502 added to the above parts. An electronic component is exemplified as the "component" in the embodiments.

First Embodiment

Figure 4:
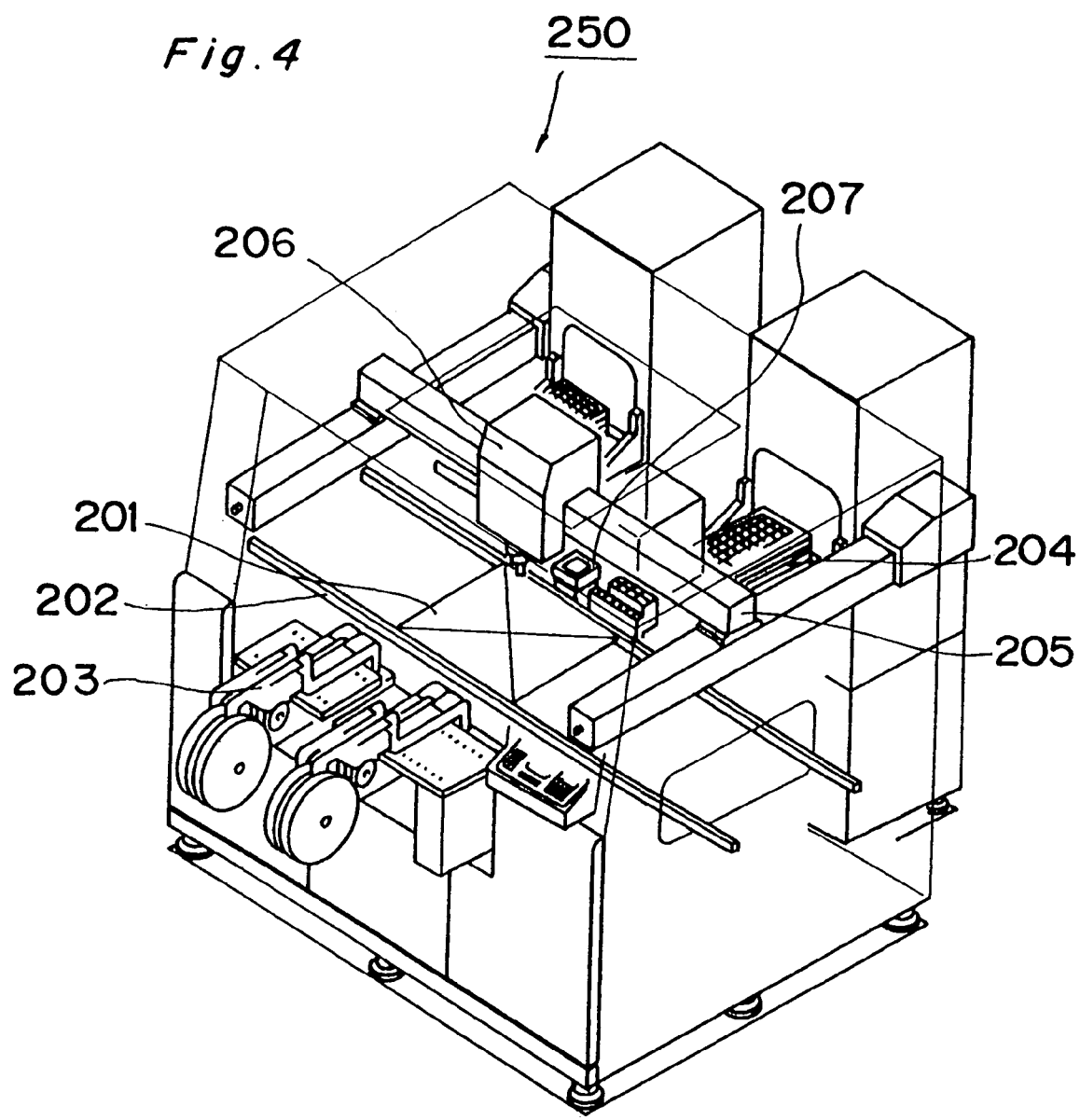
FIG. 4 is a perspective view of a component mounting apparatus having the component holding apparatus of FIG. 1.

FIG. 4 schematically shows the whole of a component mounting apparatus 250 according to a first embodiment of the present invention. 202 is a transfer part for carrying in and out an electronic circuit board 201 and, holding the circuit board 201 during a production process. 203 and 204 are electronic component feed parts for storing and feeding electronic components to be mounted to the circuit board 201. The electronic component feed part 203 is a reel-type feed part in which a tape having electronic components temporarily fixed thereto is wound in a reel, and the electronic component feed part 204 is a tray-type feed part in which electronic components are stored in a tray. A component sucking head part 206 having a nozzle 208 for sucking of electronic components moves up and down, rotates, etc. the nozzle 208, which is connected to an X-Y robot 205 which moves the head part 206 in X, Y directions. When the electronic component is to be sucked, the component sucking head part 206, i.e., nozzle 208 is moved by the X-Y robot 205 to an electronic component hold position at the electronic component feed part 203 or 204, where the component sucking head part 206 lowers the nozzle 208 to suck the electronic component and then raises the nozzle 208 after sucking the electronic component. A suction state of the electronic component sucked by the nozzle 208 is picked up by a component recognition camera 207. Whether it is necessary to correct a suction angle of the electronic component, etc. is checked on the basis of information of the picked-up image before the electronic component is mounted to the electronic circuit board 201. The electronic component sucked by the nozzle 208 is moved in X, Y directions through movement of the head part 206 by the X-Y robot 205 to a predetermined position on the electronic circuit board 201. The nozzle 208 is moved down by the operation of the head part 206, mounts the electronic component to a predetermined component mount position on the electronic circuit board 201, and releases the suction to the electronic component. Each electronic component is mounted onto the electronic circuit board 201 from the electronic component feed part 203 or 204 in repeated sequences of the above operations.

Figure 1:
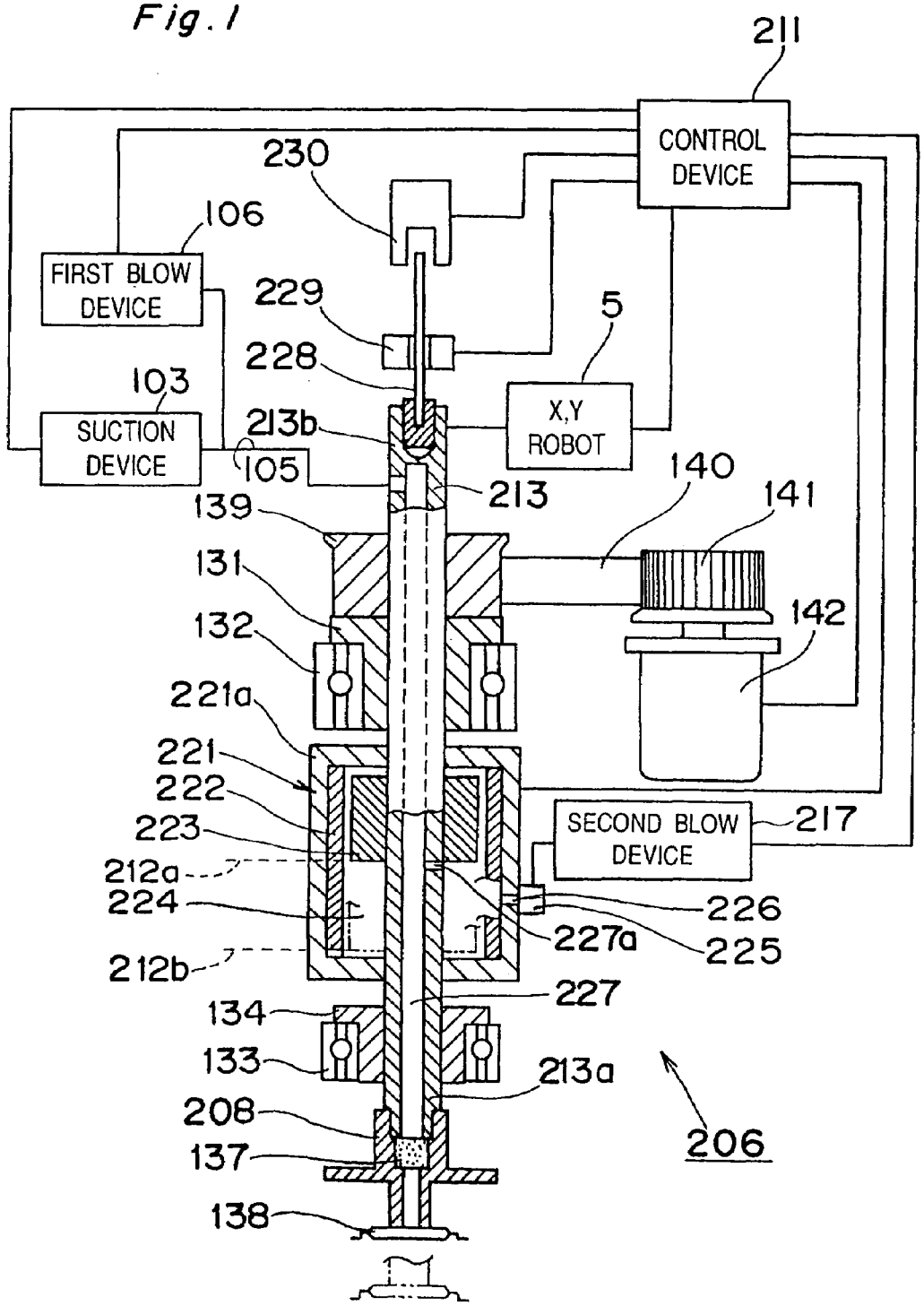
FIG. 1 is a diagram showing a component holding apparatus according to a first embodiment of the present invention.

FIG. 1 shows the component sucking head part 206 including the above-described nozzle 208, the above X-Y 18 robot 205, a suction device 103 for sucking the electronic component by the nozzle 208, a first blow device 106, a second blow device 217, and a control device 211 controlling operations of the component sucking head part 206, X-Y robot 205, suction device 103, first blow device 106 and second blow device 217. A part working the function of the "component holding apparatus" corresponds, as described before, to a part with the component sucking head part 206, suction device 103, first blow device 106, and second blow device 217. Although it is so indicated in FIG. 1 for the sake of convenience that the X-Y robot 205 directly drives a spline shaft 213 having the nozzle 208, the component sucking head part 206 is moved by the X-Y robot 205 as depicted hereinabove.

As will be discussed in detail later, according to the present embodiment in contrast to the prior art, the spline shaft 213 is provided with a voice coil motor 221 for axially moving the spline shaft 213 having the nozzle 208 set at one end part 213*a* thereof, and also a detection device for detecting a movement amount of the spline shaft 213 in the axial direction. Parts similar to those of the conventional head part 101 are described roughly here.

Two nuts 131, 134 are fitted to the spline shaft 213 along an axial direction of the spline shaft 213 to let the spline shaft 213 slide in the axial direction. These nuts 131, 134 are supported by a body part (not shown) of the component sucking head part 206 via respective bearings 132, 133. Accordingly, the spline shaft 213 is rendered movable in the axial direction relative to the body part and rotatable in a direction about an axis of the spline shaft 213. The rotation of the spline shaft 213 about the axis is carried out by a motor 142 located at the component sucking head part 206 via a belt 140. The motor 142 is connected to the control device 211. A rotation angle of the spline shaft 213 about the axis is calculated by the control device 211, for instance, on the basis of a signal sent from an encoder fitted to the motor 142. The operation of the motor 142 is feedback controlled on the basis of the calculation result, so that the rotation angle is controlled.

The nozzle 208 for sucking of the electronic component 138 is located at one end part 213*a* of the spline shaft 213. The nozzle has a filter 137 installed to prevent invasion of dust at the suction time. An air passage 227 for air sucked via the filter 137 and blow air is formed inside the spline shaft 213 along the axial direction from one end part 213*a* of the spline shaft 213 through the interior of the voice coil motor 221 (described later) to the other end part 213*b* of the spline shaft 213. Similar to the prior art device, the air passage 227 is connected with a suction tube 105 communicating with the suction device 103 at the other end part 213*b* of the spline shaft 213. The suction device 103 is connected to the control device 211 and controlled in operation by the control device 211. The suction operation of the suction device 103 sucks air from a leading end of the nozzle 208 through the air passage 227 and filter 137, thereby the electronic component 138 is sucked at the leading end part of the nozzle 208. Further, the first blow device 106 branching from the suction tube 105 is connected at the other end part 213*b* of the spline shaft 213. The first blow device 106 is also connected to the control device 211.

At a part of the spline shaft 213, which is held between the bearings 132 and 133 supporting the spline shaft 213 rotatably to the body part of the component suction head part 206, there is arranged the voice coil motor 221 using the spline shaft 213 as a driving shaft. A magnet 223 is fixed to a circumferential face of the spline shaft 213. A voice coil 222 is installed in a casing 221*a* of the can-shaped voice coil motor 221 extending in the axial direction of the spline shaft 213, more specifically, in the periphery of the magnet 223 in the axial direction of the spline shaft 213 within a movement range of the spline shaft 213 in the axial direction. The voice coil 222 is held in a state in which there is no contact with the magnet 223. The thus-arranged voice coil motor 221 is connected to the control device 211 of the component mounting apparatus and controlled in operation by the control device 211. That is, when power is fed to the voice coil 222, the magnet 223 of the voice coil motor 221 moves between a rise position 212*a* and a fall position 212*b*, thereby moving the spline shaft 213 and nozzle 208 in the axial direction. The voice coil motor 221 can be constructed in another structure wherein the voice coil is fixed to the circumferential face of the spline shaft 213 and the magnet is provided in the periphery of the voice coil in a state not in contact with the voice coil along the axial direction of the spline shaft 213 within the movement range of the spline shaft 213.

An opening is formed in the vicinity of the one end part 213*a* of the spline shaft 213 for connecting the air passage 227 with the second blow device 217. In the embodiment, a shaft opening 227*a* is formed in the air passage 227 in an internal part 224 of the voice coil motor 221 in a diametrical direction of the spline shaft 213. Moreover, a hole 226 is opened in the casing 221*a* of the voice coil motor 221. An air joint 225 fitted at a part where the hole 226 is opened at a surface of the casing 221*a* is connected to the second blow device 217 of the component mounting apparatus via a hose, which is comprised in the component sucking head part 206 or the component mounting apparatus. Both the shaft opening 227*a* and the hole 226 are opened to the internal part 224 of the voice coil motor 221. The first blow device 106 and the second blow device 217 work to feed compressed air consequent to the manipulation of valves into the air passage 227 in order to return a vacuum pressure in the air passage 227 generated by the suction device 103 to a state of atmospheric pressure. The first and second blow devices 106 and 217 are controlled in operation by the control device 211. The second blow device 217 feeds air in approximately eight times the amount supplied by the first blow device 106 according to the present embodiment. While the vacuum pressure in the air passage 227 is returned to the atmospheric pressure because of the blow operation of the first and second blow devices 106, 217, the air passage 227 can be returned to atmospheric pressure in a shorter time than in the prior art due to the addition of the second blow device 217 in the vicinity of the nozzle 208.

Meanwhile, a rod-like magnetic scale 228 is set in the axial direction coaxially with the spline shaft 213 at the other end part 213b of the spline shaft 213. The magnetic scale 228 corresponds to an embodiment functioning as a member to be detected. S and N poles are alternately magnetized via a constant interval in the axial direction of the magnetic scale 228. The magnetic scale 228 is arranged coaxially with the spline shaft 213 so as to prevent the magnetic scale 228 from rotating circlewise in consequence to the rotation of the spline shaft 213 about the axis by the motor 142, thereby facilitating magnetic detection by a magnetic sensor 229 to be described later.

In order to detect magnetism of the magnetic scale 228, the magnetic sensor 229 is fixed to the component sucking head part 206 in a state in which the sensor does not contact the magnetic scale 228. A change in magnetism due to an axial movement of the magnetic scale 228 subsequent to the axial movement of the spline shaft 213 is detected by the magnetic sensor 229 and, detected information is sent to the control device 211 from the magnetic sensor 229. A transmission sensor 230 is fixed to the component sucking head part 206 at a leading end part of the magnetic scale 228 in a state in which the transmission sensor does not touch the magnetic scale 228 to detect a movement origin of the spline shaft 213. The transmission sensor 230 has, e.g., a light-emitting element and a photodetecting element, detecting whether or not the light is shut by the leading end of the magnetic scale 228. A detection result is sent to the control device 211. The above-described magnetic scale 228, magnetic sensor 229 and transmission sensor 230 correspond to an embodiment performing the function of the detection device.

Based on the detection result supplied from the transmission sensor 230, the control device 211 judges a time point, for instance, when the absence of shutting changes to the presence of the shutting as the origin. Moreover, the control device 211 calculates a movement amount of the spline shaft 213 based on information of a change of magnetic poles magnetized to the magnetic scale 228 which is supplied from the magnetic sensor 229, and controls the power supply to the voice coil motor 221 based on the above calculation result, thereby controlling the operation of the voice coil motor 221.

The detection device for detecting the movement amount of the spline shaft 213 is not limited to the above-described magnetic scale 228, magnetic sensor 229 and transmission sensor 230. Any known instrument capable of measuring the movement amount of the spline shaft 213 is usable as the detection device.

Figure 2:
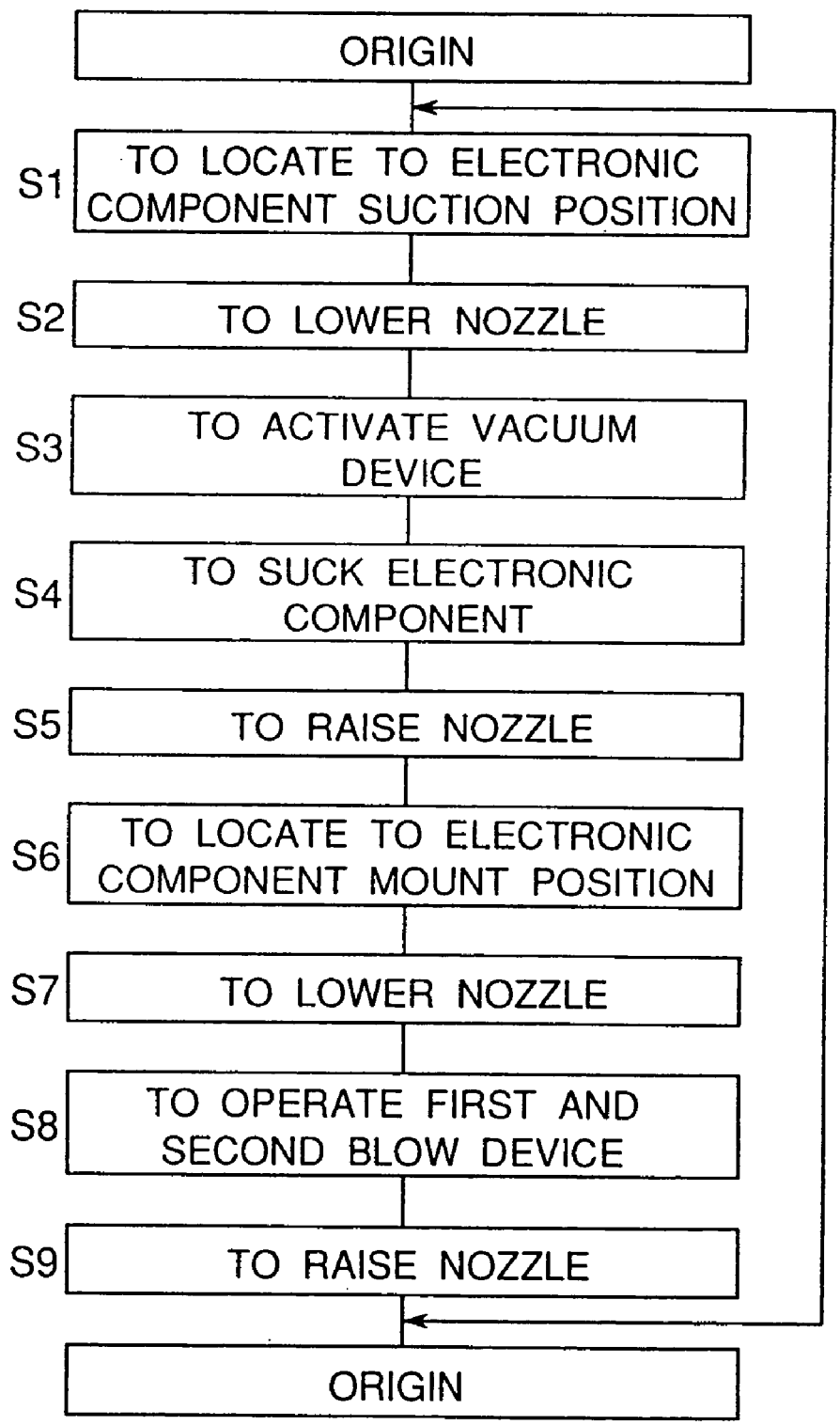
FIG. 2 is a flow chart of the operation of the component holding apparatus of FIG. 1.

The operation of the component mounting apparatus having the component holding apparatus including the component sucking head part 206 of the embodiment constructed as above will be described with reference to FIG. 2.

Under the control of the control device 211, the transfer part 202 carries in the electronic circuit board 201 from a previous process and it is supported at a mount position. On the other hand, the transmission sensor 230 of the component sucking head part 206 detects the movement origin of the spline shaft 213 when the light is shut by the leading end of the magnetic scale 228. Detected information of the origin is sent from the transmission sensor 230 to the control device 211.

At step 1, the X-Y robot 205 moves the component sucking head part 206 to the component hold position at the reel-type feed part 203 or the tray-type feed part 204 through control of the control device 211.

At step 2, under the control by the control device 211, the voice coil motor 221 is turned conductive and thus the spline shaft 213 is moved down. At this time, the control device 211 controls a descent amount of the spline shaft 213 on the basis of information output from the magnetic sensor 229 consequent to the descent of the magnetic scale 228. When the spline shaft 213 and nozzle 208 are moved down by driving of the voice coil motor 221, at step 3, the suction device 103 starts the suction operation under the control of the control device 211. The air is sucked from the leading end of the nozzle 208 through the air passage 227 and filter 137. At step 4, when the leading end of the nozzle 208 comes close to or touches the electronic component 138 stored in the reel-type feed part 203 or the tray-type feed part 204, the electronic component 138 is sucked to the leading end of the nozzle 208.

At step 5, under the control of the control device 211, the voice coil motor 221 is moved after the electronic component 138 is sucked, thereby the nozzle 208 is moved up until the magnet 223 of the voice coil motor 221 reaches the rise position 212a. The control device 211 then controls the X-Y robot 205 to move the component sucking head part 206 to a position above the component recognition camera 207. The component recognition camera 207 picks up an image of an attitude of the electronic component 138 sucked by the nozzle 208, and sends information of the picked-up image to the control device 211. If necessary, the control device 211 drives the motor 142 on the basis of the image information thereby rotating the spline shaft 213 via the belt 140 about the axis of the spline shaft 213. The attitude of the sucked electronic component is thus adjusted.

At step 6, under the control of the control device 211, the X-Y robot 205 moves the component sucking head part 206 to a position above the electronic circuit board 201. The control device 211 again supplies electricity to the voice coil motor 221 at step 7, thereby lowering the spline shaft 213 and nozzle 208. While lowering as above, the control device 211 drives the first blow device 106 and second blow device 217 at step 8 to supply air into the air passage 227. As a result, the vacuum pressure in the air passage 227 is returned to atmospheric pressure.

Figure 3:
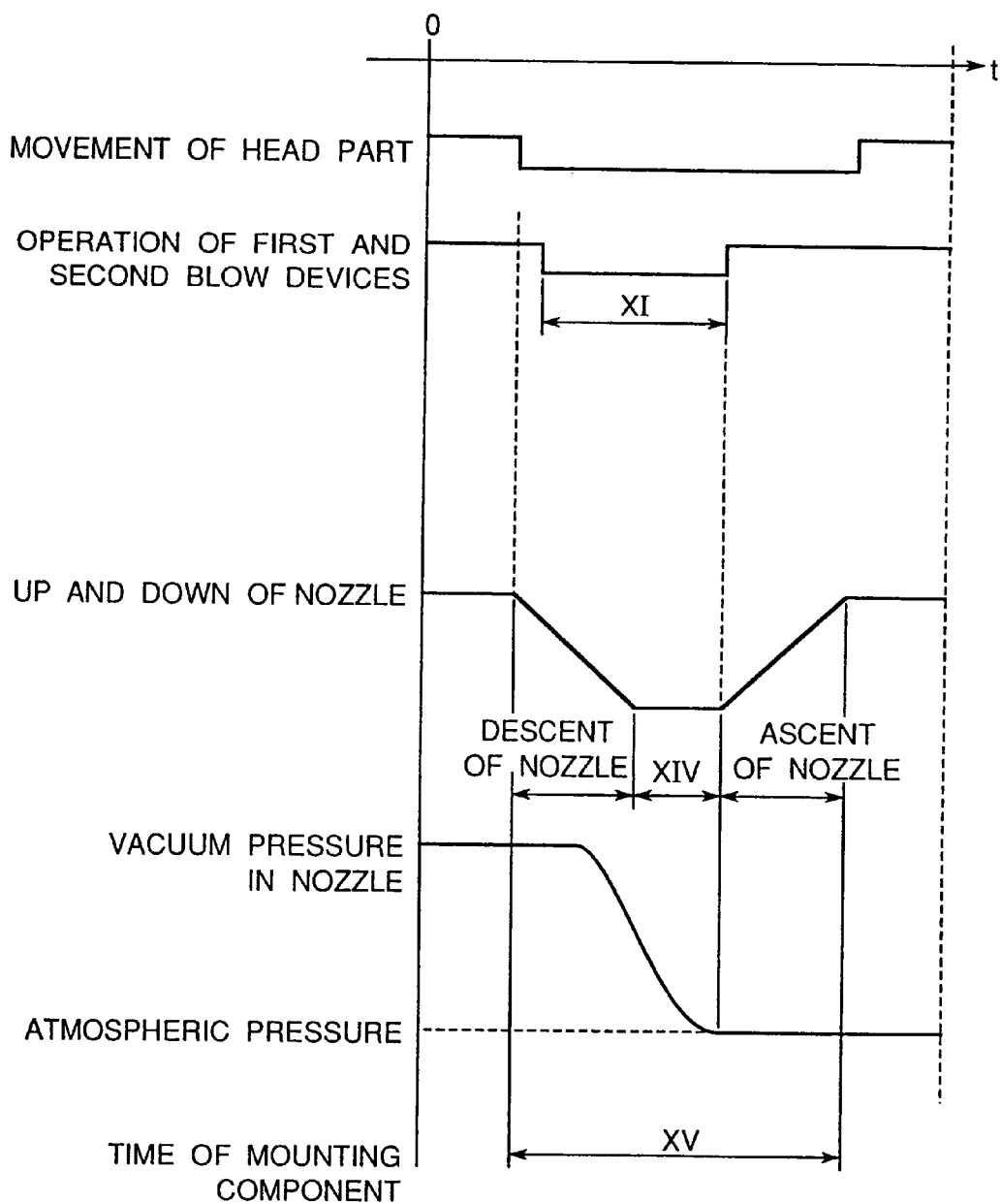
FIG. 3 is a timing chart of the operation related to the component holding apparatus shown in FIG. 1.

According to the present embodiment, although the first and second blow devices 106, 217 start to operate simultaneously, the second blow device 217 may be adapted to start earlier because the second blow device 217 has a larger air feed capacity than that of the first blow device 106. FIG. 3 indicates a timing at which the interior of the air passage 227 is returned to atmospheric pressure immediately before the nozzle 208 starts to move upward. An operation start timing of the first and second blow devices 106, 217 is set so that the interior of the air passage 227 is returned to atmospheric pressure within a period (corresponding to XIV in the drawing) from a time of the nozzle 208 reaching a lowest fall point when the magnet 223 of the voice coil motor 221 reaches the fall position 212b to a time of the nozzle 208 starting to move upward. In the present embodiment, the operation start timing is set at 40 msec earlier than the nozzle 208 reaches the lowest fall point. An operation time (corresponding to XI of FIG. 3) of the first and second blow devices 106, 217 is approximately 60 msec in the embodiment. An operation termination time of the first and second blow devices 106, 217 coincides with a time when the nozzle 208 starts to move upward.

The operation time of the first and second blow devices 106, 217 is set in the control device 211 beforehand by a timer in conformity with, e.g., a size of the component held by the nozzle 208.

For instance, when the component held by the nozzle 208 is a QFP (Quad Flat Gull Wing Leaded Package) component of a weight exceeding approximately 5 g, or an irregular shape component of a weight exceeding a weight slightly lighter than 5 g such as the QFP of a size of approximately 40×40 mm, or the irregular shape component of a connector and the like, the operation time of the first and second blow devices 106, 217 is set to a time shorter than the aforementioned about 60 msec such that the first and second blow devices 106, 217 start to operate when the nozzle 208 reaches the lowest fall point and finish when the nozzle 208 starts to move upward. The reason for this is that since a large component having the above weight is heavier than a normal component, a suction force would decrease if the blow operation were started before the nozzle 208 reaches the lowest fall point and, the held component were dropped before landing on the circuit board 201. That the held component lands on the circuit board 201 is detectable based on the movement amount of the spline shaft 213 based on the information sent from the magnetic sensor 229 and a change of a load acting on the voice coil motor 221, i.e., a change of current supplied to the voice coil motor 221. The control device 211 stores beforehand information of a mount order of components to the circuit board 201, information related to components to be mounted in accordance with the mount order information and information of a mount position of components at the circuit board 201, etc. Since the above information related to components includes information of sizes, weights, etc. of the components, the control device 211 recognizes the weight of the component being held by the nozzle 208 and can select the operation time corresponding to the component among the operation times of the first and second blow devices 106, 217 set by the timer as above.

When the interior of the air passage 227 is returned to the atmospheric pressure, the sucked electronic component 138 is mounted to the component mount position to the component mount position on the circuit board 201. At step 9, the nozzle 208 moves up after the mounting, and prepares for suction of a next component.

As described hereinabove, according to the component holding apparatus of the embodiment, and the component mounting apparatus having the component holding apparatus, the first and second two blow devices 106 and 217 are provided, and moreover, the second blow device 217 is set to perform the blow action from the vicinity of the nozzle 208. Therefore, the time required for returning the interior of the air passage 227 to the atmospheric pressure from the vacuum pressure is shortened in comparison with the prior art. A component mount time XV of FIG. 3 is shortened than the conventional time V. The component mount time XV is a period corresponding to the movement of the head part, that is, from a time when the nozzle 208 starts to fall and then sucks the component to a time of when the nozzle 208 finishes moving upward.

In the present embodiment, the spline shaft 213 is moved by the voice coil motor 221 on the spline shaft 213 and the power supply to the voice coil motor 221 is controlled by the control device 211. The spline shaft 213 is accordingly moved correctly. A pressure applied to the electronic component 138 from the nozzle 208 when the nozzle 208 sucks the electronic component 138 and when the nozzle mounts the sucked electronic component 138 to the circuit board 201 can be controlled by controlling the power to the voice coil motor 221.

The magnetic scale 228, detecting the movement of the spline shaft 213, is directly coupled to the spline shaft which is a rigid body, and also the nozzle 208 is directly coupled to the rigid spline shaft 213. Therefore, the movement amount of the magnetic scale 228 because of the axial movement of the spline shaft 213 perfectly agrees with the movement amount of the nozzle 208 in the axial direction. With the adoption of this structure, the movement amount of the spline shaft 213 when the spline shaft 213 is lowered to let the leading end of the nozzle 208 touch the electronic component 138 and when the electronic component sucked by the nozzle 208 is mounted on the electronic circuit board 201 can be correctly detected by detecting the movement amount of the magnetic scale 228.

The mounting quality of the electronic component is improved according to the present embodiment.

Though the spline shaft 213 with the nozzle 208 moves vertically in the embodiment, the movement direction of the spline shaft 213 is not restricted to this and can be set in accordance with a direction of the component feed part and the circuit board.

Although the electronic component is described as an example of the component in the embodiment, the present invention is not limited to this. Likewise, although the electronic circuit board embodiment as an object to which the component is mounted, the present invention is not limited to the electronic circuit board.

Second Embodiment

Figure 5:
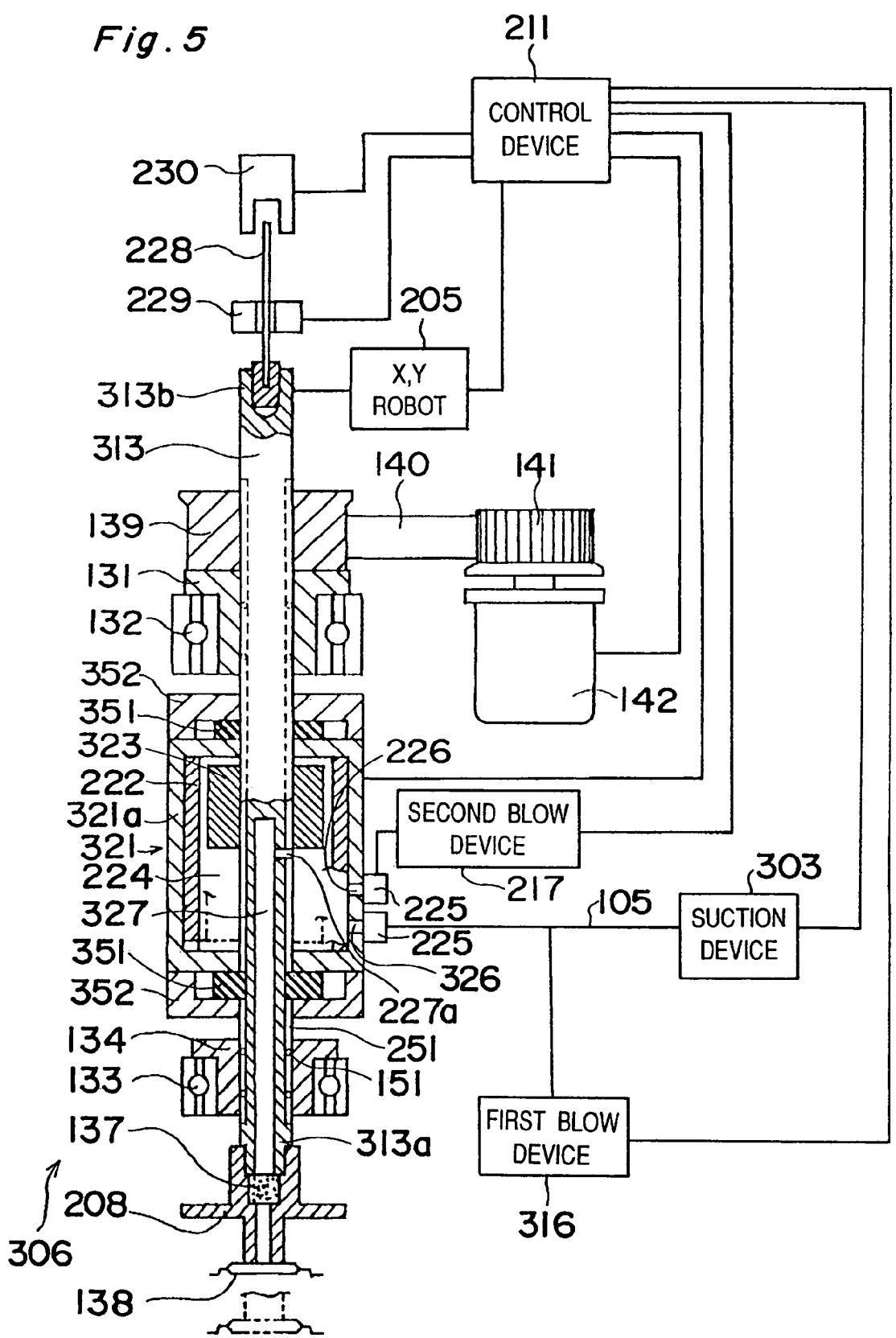
FIG. 5 is a diagram showing a component holding apparatus according to a second embodiment of the present invention.

As shown in FIG. 1 and described hereinabove, in the component holding apparatus having the component sucking head part 206 of the first embodiment, the suction of the electronic component 138 by the nozzle 208 is executed by the suction device 303 from the other end part 213b of the spline shaft 213 through the air passage 227 extending in the axial direction inside the spline shaft 213. A component holding apparatus may be constructed, which comprises a component sucking head part 306 which is a modification of the component sucking head part 206, as shown in FIG. 5. A structure of the component holding apparatus with the component sucking head part 306 is equal to that of the above-described component holding apparatus having the component sucking head part 206 except the following point. According to the component holding apparatus including the component sucking head part 306, an air passage 327 in a spline shaft 313 is formed to run only slightly beyond the shaft opening 227a from one end part 313a toward the other end part 313b, so that air in the air passage 327 is sucked by the suction device 303 through the shaft opening 227a constituting a part of the air passage 327, the internal part 224 of a voice coil motor 321, a hole 326 opened in a casing 321a of the voice coil motor 321 and the suction tube 105. The air joint 225 is set at a part where the hole 326 is opened at a surface of the casing 321a. A first blow device 316 branching from the suction tube 105 is connected to the suction tube 105. Structurally, in the component holding apparatus having the component sucking head part 306, the first blow device 316 cannot be arranged in the vicinity of the voice coil motor 321, and therefore the first blow device 316 is connected to the voice coil motor 321 via a piping of a length approximately eight times that of the second blow device 217 disposed in the vicinity of the voice coil motor 321. As such, the interior of the air passage 327 cannot be promptly returned to the atmospheric pressure by the first blow device 316 alone in the component holding apparatus with the component sucking head part 306, similar to the earlier-described first embodiment.

Figure 11:
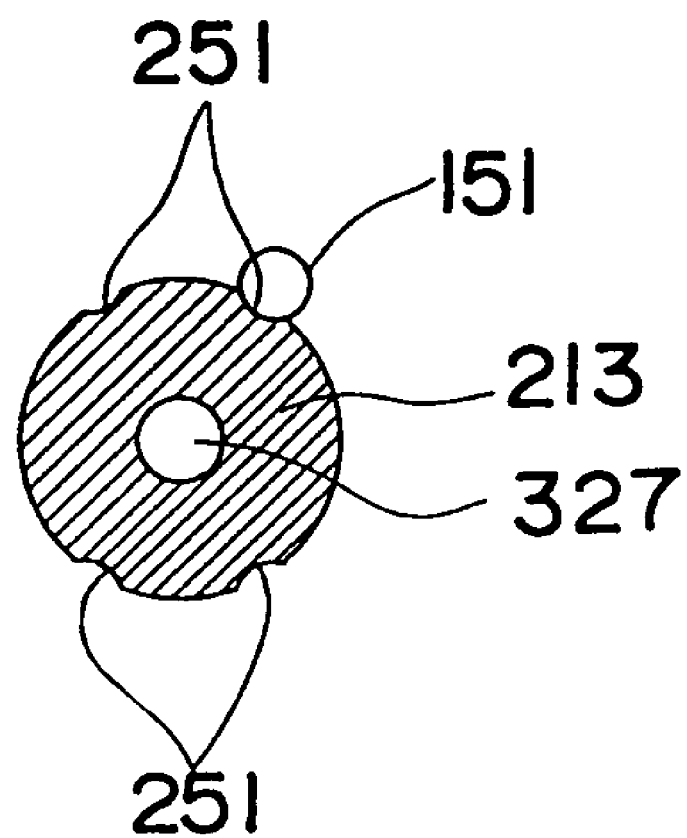
FIG. 11 is a sectional diagram of the spline shaft specifically showing a groove formed in an axial direction of the spline shaft.

An inconvenience as follows is brought about in the case where the air in the air passage 327 is sucked via the internal part 224 of the voice coil motor 321 as in the component holding apparatus having the component sucking head part 306. While two nuts 131, 134 are fitted to the spline shaft 213 to make the spline shaft 213 slidable in the axial direction as discussed before, the nuts 131, 134 allow the spline shaft 213 to slide in the axial direction through an engagement of balls 151 of the nuts 131, 134 in grooves 251 formed in a circumferential face along the axial direction of the spline shaft 213. FIG. 11 shows a sectional view of the spline shaft 213, specifically positions where the grooves 251 are formed in the direction about the axis of the spline shaft 213. The grooves 251 are similarly formed also in the spline shaft 313 of the component sucking head part 306 of the second embodiment.

Since the grooves 251 are formed nearly all over the length of the spline shaft 313 penetrating the voice coil motor 321 as shown in FIG. 5, and in the structure whereby the air in the voice coil motor 321 is sucked by the suction device 303, at a part of the spline shaft 313 where the spline shaft 313 penetrates the casing 321*a* of the voice coil motor 321, the circumferential face including the above grooves 251 should be sealed to avoid the leakage of air. What is difficult in this sealing is to secure air-tightness at the part of the grooves 251 because the spline shaft 313 not only moves in the axial direction, but rotates about the axis as discussed before.

In the first embodiment, although the interior 224 of the voice coil motor 221 and the air passage 227 communicate with each other via the shaft opening 227*a*, the suction device 103 is connected to the air passage 227 and the air in the air passage 227 is sucked mainly by the suction device 103. Therefore the aforementioned tightness does not matter. Moreover, since the blow operation by the second blow device 217 less induces tightness than the suction operation, sealing tightness can be disregarded in the first Embodiment.

Figure 6:
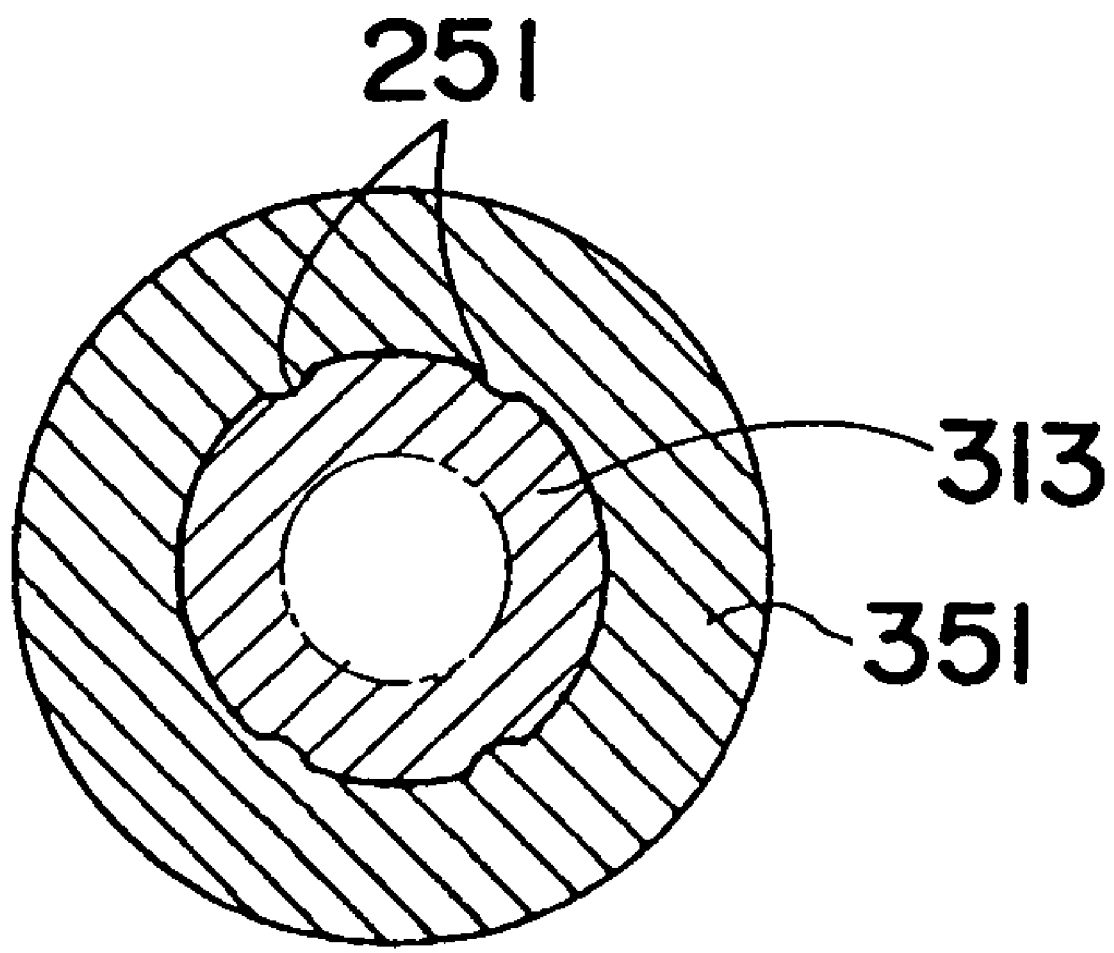
FIG. 6 is a sectional view of a first packing shown in FIG. 5.

In order to solve the above problem, according to the component holding apparatus having the component sucking head part 306 in the second embodiment, a first packing 351 is provided as a sealing member at the part where the spline shaft 313 penetrates the casing 321*a*, which is held to the casing 321*a* by a lid 352. The first packing 351 is, as is shown in FIG. 6, in the same sectional shape as the spline shaft 313, with having a hole through which the spline shaft 313*b* penetrates. The packing is formed of highly flexible material, and pressed to the casing 321*a* by the lid 352 into tight contact with an outer face of the casing 321*a* and the circumferential face of the spline shaft 313. According to the present embodiment, urethane rubber is used for the first packing 351. Because of the employment of the first packing 351 as above, the interior 224 of the voice coil motor 321 is tightly sealed, thus preventing a degree of vacuum of the interior 224 of the voice coil motor 321 from being decreased as a result of the leakage of air to the interior 224 of the voice coil motor 321 through the circumferential face of the spline shaft 313 including the grooves 251 consequent to the suction operation by the suction device 303. Sufficient suction operation by the nozzle 208 is ensured accordingly.

Third Embodiment

Figure 7:
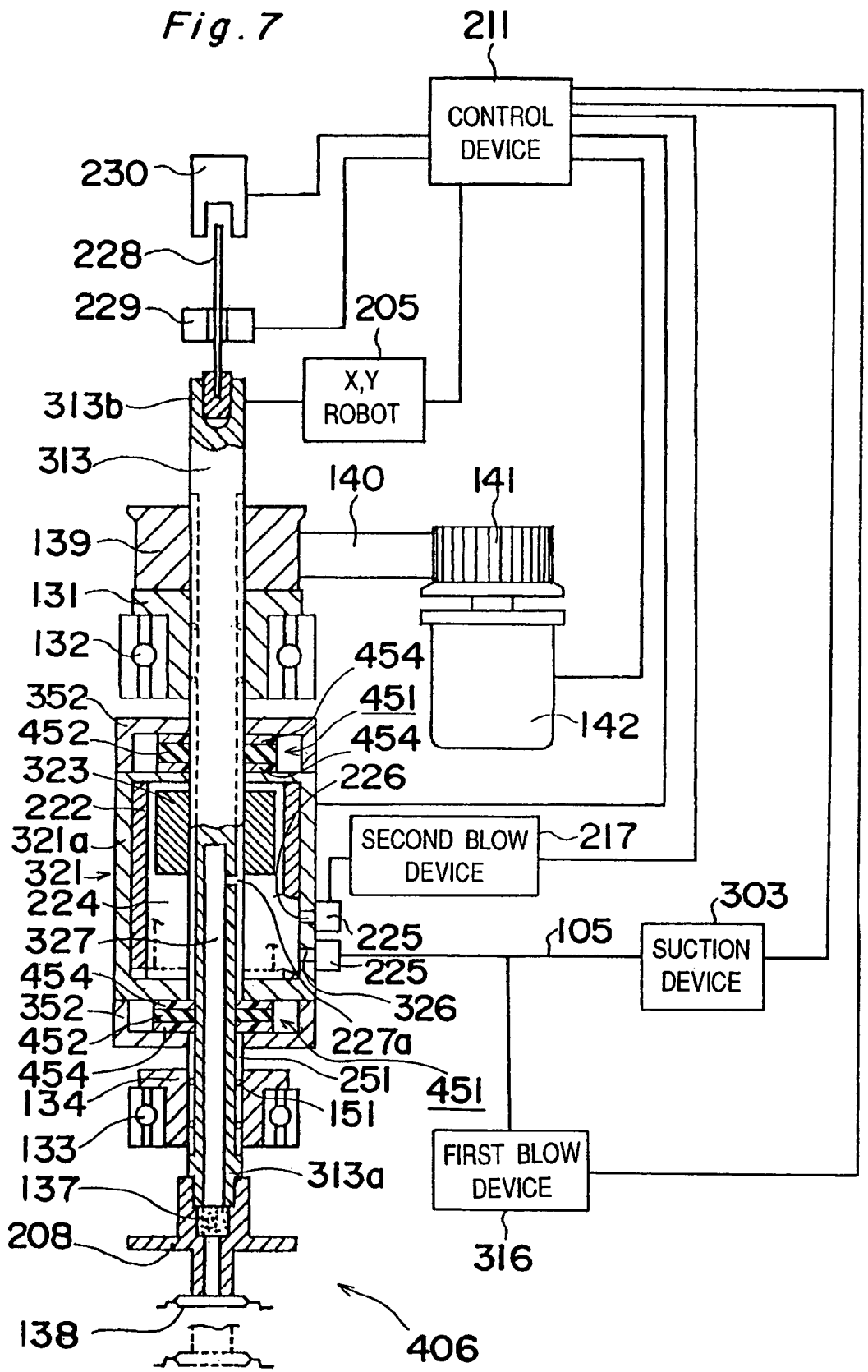
FIG. 7 is a diagram of a component holding apparatus according to a third embodiment of the present invention.
Figure 8:
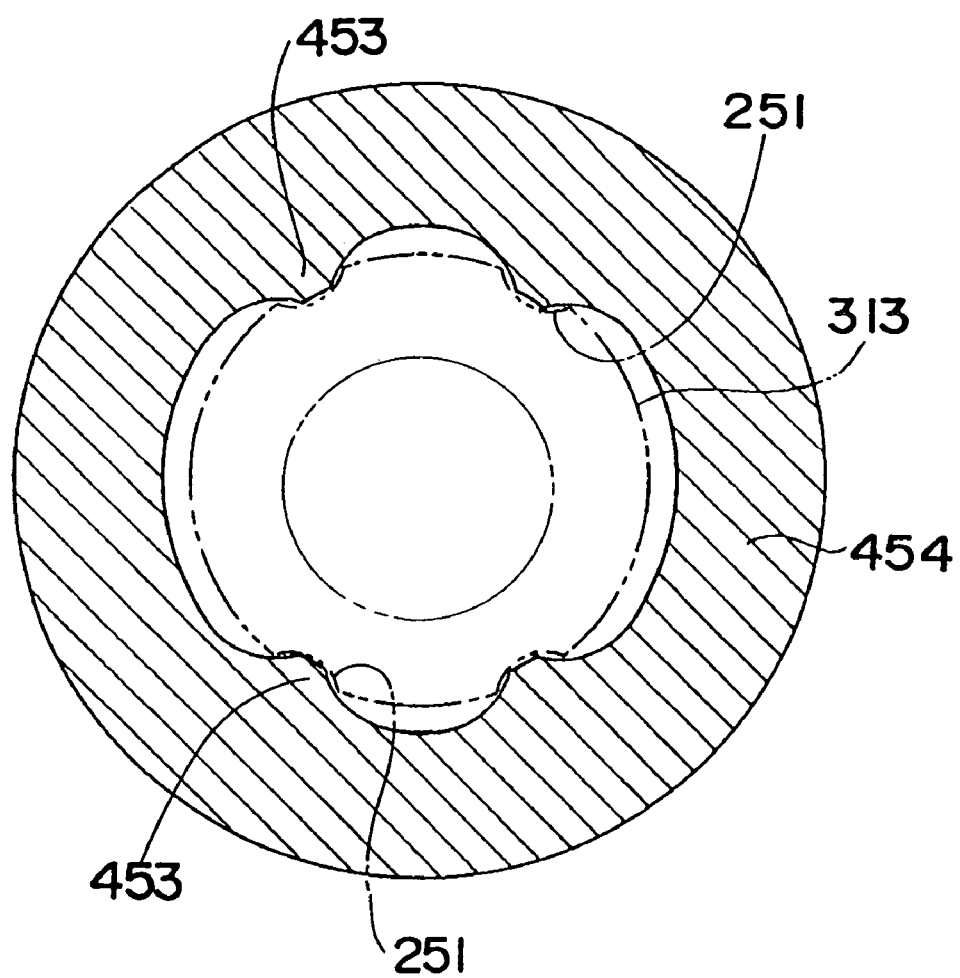
FIG. 8 is a sectional view of a second packing shown in FIG. 7.
Figure 9:
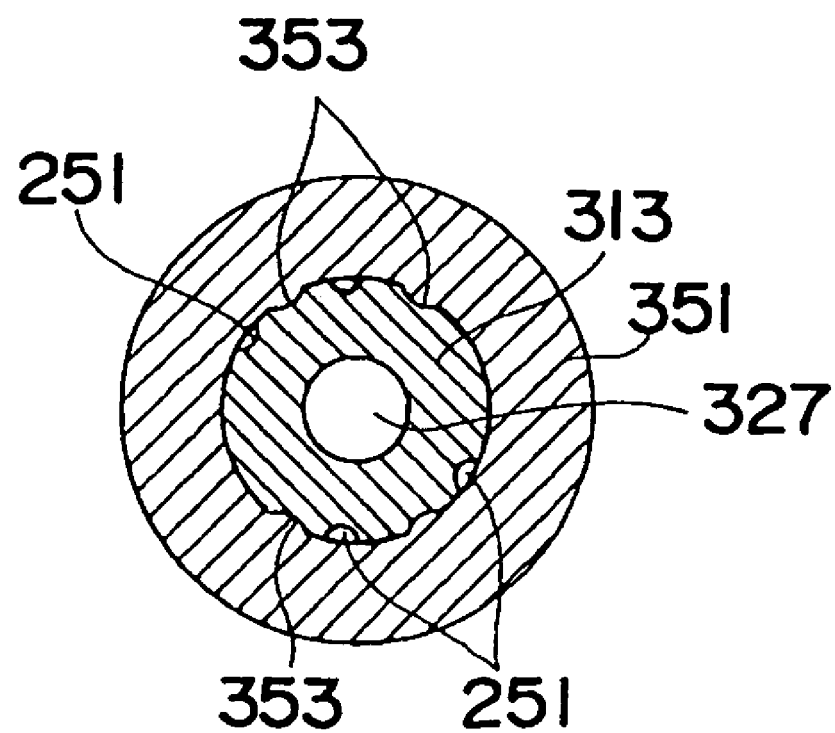
FIG. 9 is a sectional view of a state wherein the first packing of FIG. 5 deviates in a direction about an axis of a spline shaft from the spline shaft as a result of rotation of the spline shaft in the direction.

The component holding apparatus having the component sucking head part 306 of the second embodiment can be formed in a modified constitution as shown in FIG. 7. As described above, the first packing 351 uses soft material of urethane rubber or the like to enhance coherence to the spline shaft 313 and is kept in perfect contact with the spline shaft 313 in section. However, in the structure where the first packing 351 is held between the casing 321*a* and lid 352 to be directly in touch with the casing 321*a* and lid 352, the grooves 251 formed in the spline shaft 313 and projecting parts 353 formed in the first packing 351 to be engaged with the grooves 251 deviate from each other in a rotational direction due to the flexibility of the packing 351 when the spline shaft 313 rotates about the axis, as shown in FIG. 9, which possibly results in the leak of air through the grooves 251.

Therefore, in the component holding apparatus having a component sucking head part 406 of FIG. 7, a sandwich-type packing 451 is used as the sealing member in place of the first packing 351. The sandwich-type packing 451 comprises a soft first packing 452 which has a hole of the same sectional shape as the spline shaft 313 and comes in tight contact with the spline shaft 313 as well as the first packing 351, and a pair of second packings 454 of higher rigidity than the first packing 452. The second packing 454 has projecting parts 453 which are meshed in the grooves 251 of the spline shaft 313, thereby rotating the second packing 454 to follow the rotation of the spline shaft 313 about the axis, thus eliminating a relative displacement to the spline shaft 313. The first packing 452 is sandwiched between the second packings 454. The sandwich-type packing 451 is pressed by the lid 352 to the casing 321*a* and thus set with the second packings 454 kept in touch with the casing 321*a* and lid 352.

In the component holding apparatus having the component sucking head part 406, the first packing 451 is formed of urethane rubber, similar to the packing 351. The second packing 454 is formed of DURACON (trademark of duPont Co.) of 100–1000 times a rigidity of urethane rubber. Since the second packing 454 has high rigidity, the second packing 454 can rotate integrally with the spline shaft 313 simply when the projecting parts 453 are engaged in the grooves 251. The projecting parts 453 of the second packing 454 may be formed with the utilization of a drilling treatment, so that process costs are reduced. If it is so designed at a drilling process of the drilling treatment as to reduce a contact part between the circumferential face of the spline shaft 313 and the second packing 454, a frictional resistance of the spline shaft 313 and second packing 454 is lessened and a long life is secured for the second packing 454. A slight amount of grease or the like is applied to the contact part between the sandwich-type packing 451 and the spline shaft 313, casing 321*a* and lid 352 to enhance vacuum sealing properties.

When the spline shaft 313 rotates about the axis, the second packings 454 constituting the above-formed sandwich-type packing 451 integrally rotate with the spline shaft 313 in coincident with the rotation of the spline shaft 313 in a state to be in touch with the casing 321*a* and lid 352. Since the first packing 452 rotates synchronously with the second packings 454, the spline shaft 313 and the first packing 452 never deviate from each other in the rotational direction, whereby the degree of vacuum in the internal part 224 of the voice coil motor 321 is prevented from decreasing and sufficient suction operation by the nozzle 208 is secured.

Fourth Embodiment

Figure 10:
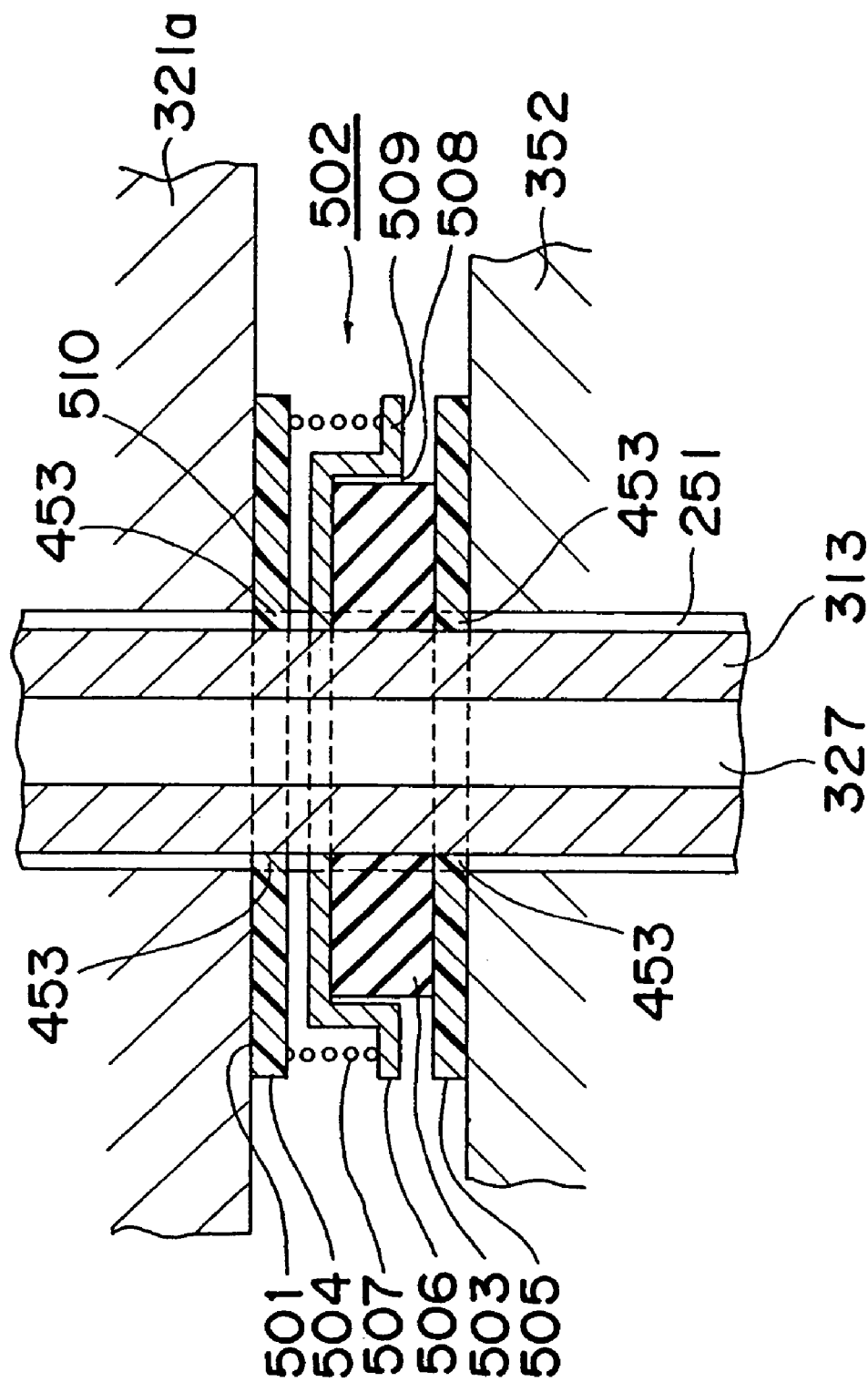
FIG. 10 is a sectional diagram of a press-type packing installed in a component holding apparatus according to a fourth embodiment of the present invention.

The sandwich-type packing 451 in the above third embodiment can be modified in a constitution shown in FIG. 10. The first blow device 316 and second blow device 217 inject air to the internal part 224 of the voice coil motor 321. The injected air is apt to flow outside through the internal part 224 of the voice coil motor 321 through the grooves 251 of the spline shaft 313 at the part where the spline shaft 313 penetrates the casing 321a. At this time, in FIG. 10, the injected air sometimes leaks outside through a part of a contact face 501 between the second packing 454 of the sandwich-type packing 451 and the casing 321a of the voice coil motor 321. Once the air leaks through the contact face part 501, an air passage is formed at the contact face part 501. So, it is conceivable that a disadvantage hindering the suction operation by the suction device 303 may be arised.

In the fourth embodiment, a press-type packing 502 shown in FIG. 10 is provided as the sealing member at the part where the spline shaft 313 penetrates the casing 321a of the voice coil motor 321. The press-type packing 502 comprises a third packing 503, a packing 504 at the side of the motor in touch with the casing 321a of the voice coil motor 321, a packing 505 at the side of the lid in touch with the lid 352, and a pressing member constructed by a base member 506 and an urging member 507.

Similar to the above-described first packings 351, 452, the third packing 503 has a hole of the same sectional shape as the spline shaft 313, is soft in tight contact with the spline shaft 313 and formed of urethane rubber.

The packing 504 at the side of the motor and packing 505 at the side of the lid correspond to the above second packings 454. A pair of packing is formed by the packings 504, 505. Each of the packings 504, 505 of high rigidity has projecting parts 453 which are engaged with the grooves 251 of the spline shaft 313 thereby rotating the packings 504, 505 in accordance with the rotation of the spline shaft 313 about the axis of the spline shaft 313 to eliminate the relative displacement in the rotational direction to the spline shaft 313. The packings 504, 505 are formed of DURACON (trademark of duPont Co.), similar to the second packings 454. The third packing 503 is interposed between the packings 504 and 505.

Figure 12:
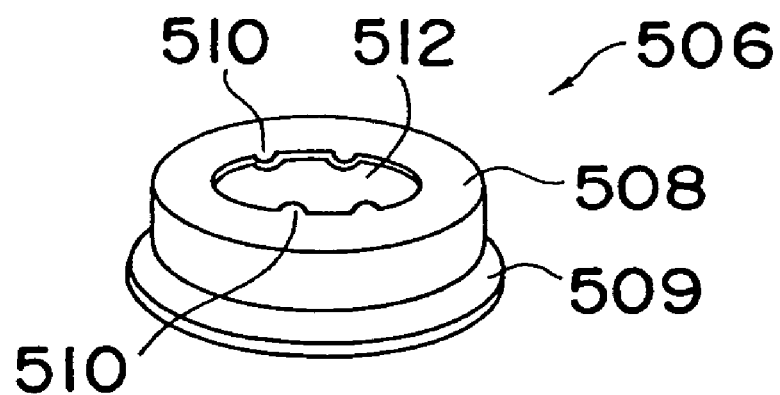
FIG. 12 is a perspective view of a base member of the press-type packing of FIG. 10.

As shown in FIG. 12, the base member 506 includes a recessed part 508 having an opening 512 in which the third packing 503 is fitted and through which the spline shaft 313 penetrates, and a flange part 509 provided at the recessed part 508 to which the urging member 507 is brought into contact. Projecting parts 510 are formed at the opening 512 of the recessed part 508, which are engaged with the grooves 251 of the spline shaft 313 similar to the projecting parts 453, thereby preventing the relative displacement in the rotational direction of the base member 506 to the rotation of the spline shaft 313.

The urging member 507 is set between the third packing 503 and packing 504 at the side of the motor, that is, in the embodiment between the flange part 509 and the packing 504 at the side of the motor, pressing the packing 504 to the casing 321a of the voice coil motor 321 with a force of 30–40 g. Although a spring is used as the urging member 507 in the embodiment, anything that generates the above urging force is utilizable and the urging member is not limited to the spring.

In the presence of the press-type packing 502 constituted as above, similar to the sandwich-type packing 451, the packing 504 at the side of the motor and the packing 505 at the side of the lid rotate integrally with the spline shaft 313 in coincident with the rotation thereof while keeping touch with the casing 321a and lid 352 when the spline shaft 313 rotates about the axis. Thus, since the third packing 503 rotates synchronously with the packings 504 and 505, the spline shaft 313 and the third packing 503 never deviate from each other in the rotational direction, thereby avoiding a decrease of the degree of vacuum in the interior 224 of the voice coil motor 321. So, sufficient suction operation by the nozzle 208 is hence ensured. In addition, even if the air passage is defined, through which the air injected by the blow operation to leak outside between the contact face part 501 of the casing 321a of the voice coil motor 321 and the packing 504 at the side of the motor, since the packing 504 of the press-type packing 502 is pressed to the casing 321a of the voice coil motor 321 by the urging member 507, the air passage formed at the contact face part 501 is broken and shut when the blow operation is finished. The suction operation is accordingly never obstructed.

Figure 13:
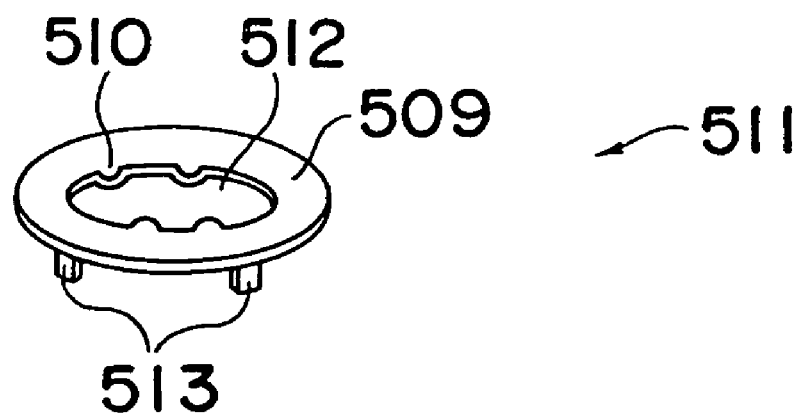
FIG. 13 is a perspective view of a modified example of the base member.

Although the recessed part 508 is formed at the base member 506 of the above press-type packing 502, the base member 506 is not limited in the above form. In other words, the recessed part 508 acts to prevent a positional displacement of the base member 506 to the third packing 503 and therefore is not required to be recessed so long as it exerts the action. For instance, a constitution as a base member 511 as shown in FIG. 13 may be formed, which has a member 513 for prevention of the positional displacement projected on a circular plate material functioning as the opening 512 and the flange part 509.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. An apparatus for holding a component, comprising:
  a shaft having a nozzle at one end of said shaft, said shaft being movable in an axial direction of said shaft and rotatable about an axis of said shaft;
  a voice coil motor extending in said axial direction of said shaft, said voice coil motor including
    (i) a casing through which said shaft extends,
    (ii) one of a magnet and a coil fixed to a circumferential face of said shaft, and
    (iii) the other of said magnet and said coil positioned within said casing and surrounding said one of said magnet and said coil,
    with said shaft being movable in said axial direction via action of said magnet and said coil, and with said shaft having an air passage connecting said nozzle with an interior of said casing;
  a suction device connected to said voice coil motor and communicating with said air passage and said nozzle such that when said suction device is activated air is sucked from the interior of said casing and said air passage so as to cause said nozzle to suck and hold a component;
  a first blow device connected to said voice coil motor such that when said first blow device is activated air is supplied into the interior of said casing and into said air passage for returning the interior of said casing and said air passage to an atmospheric state so as to release the component from said nozzle;
  a second blow device connected to said voice coil motor such that when said second blow device is activated air is supplied into the interior of said casing and into said air passage for returning the interior of said casing and said air passage to an atmospheric state, faster than said first blow device is to return the interior of said casing and said air passage to an atmospheric state, so as to release the component from said nozzle; and
  a sealing member including a first packing, at a part of said casing where said shaft passes through said casing, for preventing passage of air into the interior of said casing while said suction device is activated, said first packing having
(i) a sectional shape that is the same as a sectional shape of said shaft, and
(ii) a hole through which said shaft extends.

2. The apparatus according to claim 1, further comprising:
a groove, extending in said axial direction, in said circumferential face of said shaft,
wherein said sealing member further includes two second packings between which is sandwiched said first packing, said two second packings being of a material having a rigidity greater than a rigidity of a material of said first packing, said two second packings each having a hole through which said shaft extends, and said two second packings also each having a projection extending into said groove such that said two second packings are rotatable with said shaft without any relative displacement between said shaft and said two second packings.

3. The apparatus according to claim 2, wherein
one of said two second packings is in contact with said casing, and
said sealing member further includes an urging member between said first packing and said one of said two second packings,
such that said urging member urges said one of said two second packings against said casing with a force sufficient to eliminate air pressure generated at an interface of said casing and said one of said two second packings when the interior of said casing is returned to the atmospheric state by either said first blow device or said second blow device, so as to prevent leakage of air during activation of said suction device.

4. The apparatus according to claim 3, further comprising:
a control device connected to said first blow device and said second blow device, said control device for controlling an air feed start time of said first blow device and said second blow device such that said air passage is returned to the atmospheric state during a period from when said nozzle holds a component and reaches a lowest fall point to a time when said nozzle starts to rise so as to have the component released from said nozzle and mounted onto an object.

5. The apparatus according to claim 4, wherein
said control device is for controlling the air feed start time based on a weight of the component held by said nozzle such that if the weight of the component held by said nozzle exceeds approximately 5 g the air feed start time is a point in time when said nozzle reaches the lowest fall point.

6. The apparatus according to claim 2, further comprising:
a control device connected to said first blow device and said second blow device, said control device for controlling an air feed start time of said first blow device and said second blow device such that said air passage is returned to the atmospheric state during a period from when said nozzle holds a component and reaches a lowest fall point to a time when said nozzle starts to rise so as to have the component released from said nozzle and mounted onto an object.

7. The apparatus according to claim 6, wherein
said control device is for controlling the air feed start time based on a weight of the component held by said nozzle such that if the weight of the component held by said nozzle exceeds approximately 5 g the air feed start time is a point in time when said nozzle reaches the lowest fall point.

8. The apparatus according to claim 1, further comprising:
a control device connected to said first blow device and said second blow device, said control device for controlling an air feed start time of said first blow device and said second blow device such that said air passage is returned to the atmospheric state during a period from when said nozzle holds a component and reaches a lowest fall point to a time when said nozzle starts to rise so as to have the component released from said nozzle and mounted onto an object.

9. The apparatus according to claim 8, wherein
said control device is for controlling the air feed start time based on a weight of the component held by said nozzle such that if the weight of the component held by said nozzle exceeds approximately 5 g the air feed start time is a point in time when said nozzle reaches the lowest fall point.

10. An apparatus for mounting a component, comprising:
a shaft having a nozzle at one end of said shaft, said shaft being movable in an axial direction of said shaft and rotatable about an axis of said shaft;
a voice coil motor extending in said axial direction of said shaft, said voice coil motor including
(i) a casing through which said shaft extends,
(ii) one of a magnet and a coil fixed to a circumferential face of said shaft, and
(iii) the other of said magnet and said coil positioned within said casing and surrounding said one of said magnet and said coil,
with said shaft being movable in said axial direction via action of said magnet and said coil, and with said shaft having an air passage connecting said nozzle with an interior of said casing;
a suction device connected to said voice coil motor and communicating with said air passage and said nozzle such that when said suction device is activated air is sucked from the interior of said casing and said air passage so as to cause said nozzle to suck and hold a component;
a first blow device connected to said voice coil motor such that when said first blow device is activated air is supplied into the interior of said casing and into said air passage for returning the interior of said casing and said air passage to an atmospheric state so as to release the component from said nozzle;
a second blow device connected to said voice coil motor such that when said second blow device is activated air is supplied into the interior of said casing and into said air passage for returning the interior of said casing and said air passage to an atmospheric state, faster than said first blow device is to return the interior of said casing and said air passage to an atmospheric state, so as to release the component from said nozzle; and
a sealing member including a first packing, at a part of said casing where said shaft passes through said casing, for preventing passage of air into the interior of said casing while said suction device is activated, said first packing having
(i) a sectional shape that is the same as a sectional shape of said shaft, and
(ii) a hole through which said shaft extends.

11. The apparatus according to claim 10, further comprising:
   a groove, extending in said axial direction, in said circumferential face of said shaft,
   wherein said sealing member further includes two second packings between which is sandwiched said first packing, said two second packings being of a material having a rigidity greater than a rigidity of a material of said first packing, said two second packings each having a hole through which said shaft extends, and said two second packings also each having a projection extending into said groove such that said two second packings are rotatable with said shaft without any relative displacement between said shaft and said two second packings.

12. The apparatus according to claim 11, wherein
   one of said two second packings is in contact with said casing, and
   said sealing member further includes an urging member between said first packing and said one of said two second packings,
   such that said urging member urges said one of said two second packings against said casing with a force sufficient to eliminate air pressure generated at an interface of said casing and said one of said two second packings when the interior of said casing is returned to the atmospheric state by either said first blow device or said second blow device, so as to prevent leakage of air during activation of said suction device.

13. The apparatus according to claim 12, further comprising:
   a control device connected to said first blow device and said second blow device, said control device for controlling an air feed start time of said first blow device and said second blow device such that said air passage is returned to the atmospheric state during a period from when said nozzle holds a component and reaches a lowest fall point to a time when said nozzle starts to rise so as to have the component released from said nozzle and mounted onto an object.

14. The apparatus according to claim 13, wherein
   said control device is for controlling the air feed start time based on a weight of the component held by said nozzle such that if the weight of the component held by said nozzle exceeds approximately 5 g the air feed start time is a point in time when said nozzle reaches the lowest fall point.

15. The apparatus according to claim 11, further comprising:
   a control device connected to said first blow device and said second blow device, said control device for controlling an air feed start time of said first blow device and said second blow device such that said air passage is returned to the atmospheric state during a period from when said nozzle holds a component and reaches a lowest fall point to a time when said nozzle starts to rise so as to have the component released from said nozzle and mounted onto an object.

16. The apparatus according to claim 15, wherein
   said control device is for controlling the air feed start time based on a weight of the component held by said nozzle such that if the weight of the component held by said nozzle exceeds approximately 5 g the air feed start time is a point in time when said nozzle reaches the lowest fall point.

17. The apparatus according to claim 10, further comprising:
   a control device connected to said first blow device and said second blow device, said control device for controlling an air feed start time of said first blow device and said second blow device such that said air passage is returned to the atmospheric state during a period from when said nozzle holds a component and reaches a lowest fall point to a time when said nozzle starts to rise so as to have the component released from said nozzle and mounted onto an object.

18. The apparatus according to claim 17, wherein
   said control device is for controlling the air feed start time based on a weight of the component held by said nozzle such that if the weight of the component held by said nozzle exceeds approximately 5 g the air feed start time is a point in time when said nozzle reaches the lowest fall point.

* * * * *